United States Patent
Vedula et al.

(10) Patent No.: US 10,637,411 B2
(45) Date of Patent: Apr. 28, 2020

(54) TRANSISTOR LAYOUT FOR IMPROVED HARMONIC PERFORMANCE

(71) Applicant: QUALCOMM Incorporated, San Diego, CA (US)

(72) Inventors: Ravi Pramod Kumar Vedula, San Diego, CA (US); Sinan Goktepeli, San Diego, CA (US); George Pete Imthurn, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 102 days.

(21) Appl. No.: 15/959,562

(22) Filed: Apr. 23, 2018

(65) Prior Publication Data

US 2019/0109570 A1    Apr. 11, 2019

Related U.S. Application Data

(60) Provisional application No. 62/569,433, filed on Oct. 6, 2017.

(51) Int. Cl.
*H03F 3/195* (2006.01)
*H01L 29/786* (2006.01)
(Continued)

(52) U.S. Cl.
CPC .............. *H03F 3/195* (2013.01); *H01L 21/84* (2013.01); *H01L 23/66* (2013.01); *H01L 27/092* (2013.01);
(Continued)

(58) Field of Classification Search
CPC ................................ H03F 3/195; H01L 21/84
See application file for complete search history.

(56) References Cited

U.S. PATENT DOCUMENTS

| 7,550,781 B2 | 6/2009 | Kinzer et al. |
| 7,928,517 B2 | 4/2011 | Tiemeijer et al. |

(Continued)

FOREIGN PATENT DOCUMENTS

| EP | 2565877 A1 | 3/2013 |
| WO | 2017034929 A1 | 3/2017 |

OTHER PUBLICATIONS

International Search Report and Written Opinion—PCT/US2018/047358—ISA/EPO—dated Nov. 29, 2018.

*Primary Examiner* — Lex H Malsawma
*Assistant Examiner* — Xia L Cross
(74) *Attorney, Agent, or Firm* — Qualcomm Incorporated/Seyfarth Shaw LLP

(57) ABSTRACT

A radio frequency integrated circuit (RFIC) includes multi-finger transistors including discrete diffusion regions and interconnected within a reconfigured form factor as a single switch transistor. The RFIC also includes a source bus having a first plurality of source fingers coupled to each source region of the multi-finger transistors and a second plurality of source fingers orthogonally coupled to the first plurality of source fingers. The second plurality of source fingers couple the discrete diffusion regions in parallel. The RFIC also includes a drain bus having a first plurality of drain fingers coupled to each drain region of the multi-finger transistors and a second plurality of drain fingers orthogonally coupled to the first plurality of drain fingers. The second plurality of drain fingers electrically couple the discrete diffusion regions in parallel. The RFIC further includes a plurality of interconnected body contacts to bias a body of each of the multi-finger transistors.

19 Claims, 9 Drawing Sheets

(51) Int. Cl.
*H01L 29/417* (2006.01)
*H01L 21/84* (2006.01)
*H03F 3/24* (2006.01)
*H01L 23/66* (2006.01)
*H01L 27/092* (2006.01)
*H01L 27/12* (2006.01)
*H01L 29/06* (2006.01)
*H03F 1/26* (2006.01)
*H03F 3/193* (2006.01)

(52) U.S. Cl.
CPC ...... *H01L 27/1203* (2013.01); *H01L 29/0642* (2013.01); *H01L 29/41733* (2013.01); *H01L 29/78615* (2013.01); *H03F 1/26* (2013.01); *H03F 3/193* (2013.01); *H03F 3/245* (2013.01)

(56) References Cited

U.S. PATENT DOCUMENTS

| | | |
|---|---|---|
| 8,869,085 B2 | 10/2014 | Lu |
| 9,721,936 B2 | 8/2017 | Zhu et al. |
| 9,806,094 B2 | 10/2017 | Whitefield et al. |
| 2002/0140024 A1 | 10/2002 | Aoki et al. |
| 2014/0346601 A1 | 11/2014 | Sugiura et al. |
| 2015/0061038 A1 | 3/2015 | Takewaki et al. |
| 2017/0194490 A1* | 7/2017 | Li .................... H01L 21/76897 |
| 2017/0213848 A1 | 7/2017 | Nishihori et al. |
| 2017/0250200 A1* | 8/2017 | Lee .................... H01L 27/1255 |

* cited by examiner

TRANSISTOR LAYOUT FOR IMPROVED HARMONIC PERFORMANCE

CROSS-REFERENCE TO RELATED APPLICATION

This application claims the benefit of U.S. Provisional Patent Application No. 62/569,433, filed on Oct. 6, 2017, entitled "TRANSISTOR LAYOUT FOR IMPROVED HARMONIC PERFORMANCE," the disclosure of which is expressly incorporated by reference herein in its entirety.

TECHNICAL FIELD

The present disclosure generally relates to integrated circuits (ICs). More specifically, the present disclosure relates to a transistor layout for improved harmonic performance.

BACKGROUND

The design complexity of mobile radio frequency (RF) chips (e.g., mobile RF transceivers) is complicated by added circuit functions for supporting communication enhancements. Designing mobile RF transceivers may include using semiconductor on insulator technology. Semiconductor on insulator (SOI) technology replaces conventional semiconductor (e.g., silicon) substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on the SOI layer and an SOI substrate supporting the BOX layer.

For example, high performance complementary metal oxide semiconductor (CMOS) radio frequency (RF) switch technologies are currently manufactured using SOI substrates. While SOI substrates may provide some protection against undesired, out-of-band harmonics in RF transceivers, there is a need for increasing device isolation and reducing RF loss. Furthermore, a transistor fabricated using SOI technology may suffer from the floating body effect, in which the transistor's body collects charge generated at the junctions of the transistor device.

SUMMARY

A radio frequency integrated circuit (RFIC) includes multi-finger transistors including discrete diffusion regions and interconnected within a reconfigured form factor as a single switch transistor. The RFIC also includes a source bus having a first plurality of source fingers coupled to each source region of the multi-finger transistors and a second plurality of source fingers orthogonally coupled to the first plurality of source fingers. The second plurality of source fingers couple the discrete diffusion regions in parallel. The RFIC also includes a drain bus having a first plurality of drain fingers coupled to each drain region of the multi-finger transistors and a second plurality of drain fingers orthogonally coupled to the first plurality of drain fingers. The second plurality of drain fingers electrically couple the discrete diffusion regions in parallel. The RFIC further includes a plurality of interconnected body contacts to bias a body of each of the multi-finger transistors.

A method of constructing an radio frequency (RF) integrated circuit may include laying out a plurality of multi-finger transistors including discrete diffusion regions and interconnected within a reconfigured form factor as a single switch transistor. The method may also include forming a source bus having a plurality of source fingers coupled to each source region of the plurality of multi-finger transistors. The method may also include forming a drain bus having a plurality of drain fingers coupled to each drain region of the plurality of multi-finger transistors. The method may also include depositing a body contact on each of the discrete diffusion regions. The method may further include interconnecting the body contact on each of the discrete diffusion regions using an interconnect layer.

A radio frequency integrated circuit (RFIC) may include a plurality of multi-finger transistors including discrete diffusion regions and interconnected within a reconfigured form factor as a single switch transistor. The RFIC may also include a source bus having a first plurality of source fingers coupled to each source region of the plurality of multi-finger transistors and a second plurality of source fingers orthogonally coupled to the first plurality of source fingers. The second plurality of source fingers couple the discrete diffusion regions in parallel. The RFIC may also include a drain bus having a first plurality of drain fingers coupled to each drain region of the plurality of interconnected transistors and a second plurality of drain fingers orthogonally coupled to the first plurality of drain fingers. The second plurality of drain fingers electrically couple the discrete diffusion regions in parallel. The RFIC may further include means for interconnecting a plurality of body contacts to the discrete diffusion regions to bias a body of each of the plurality of interconnected transistors.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
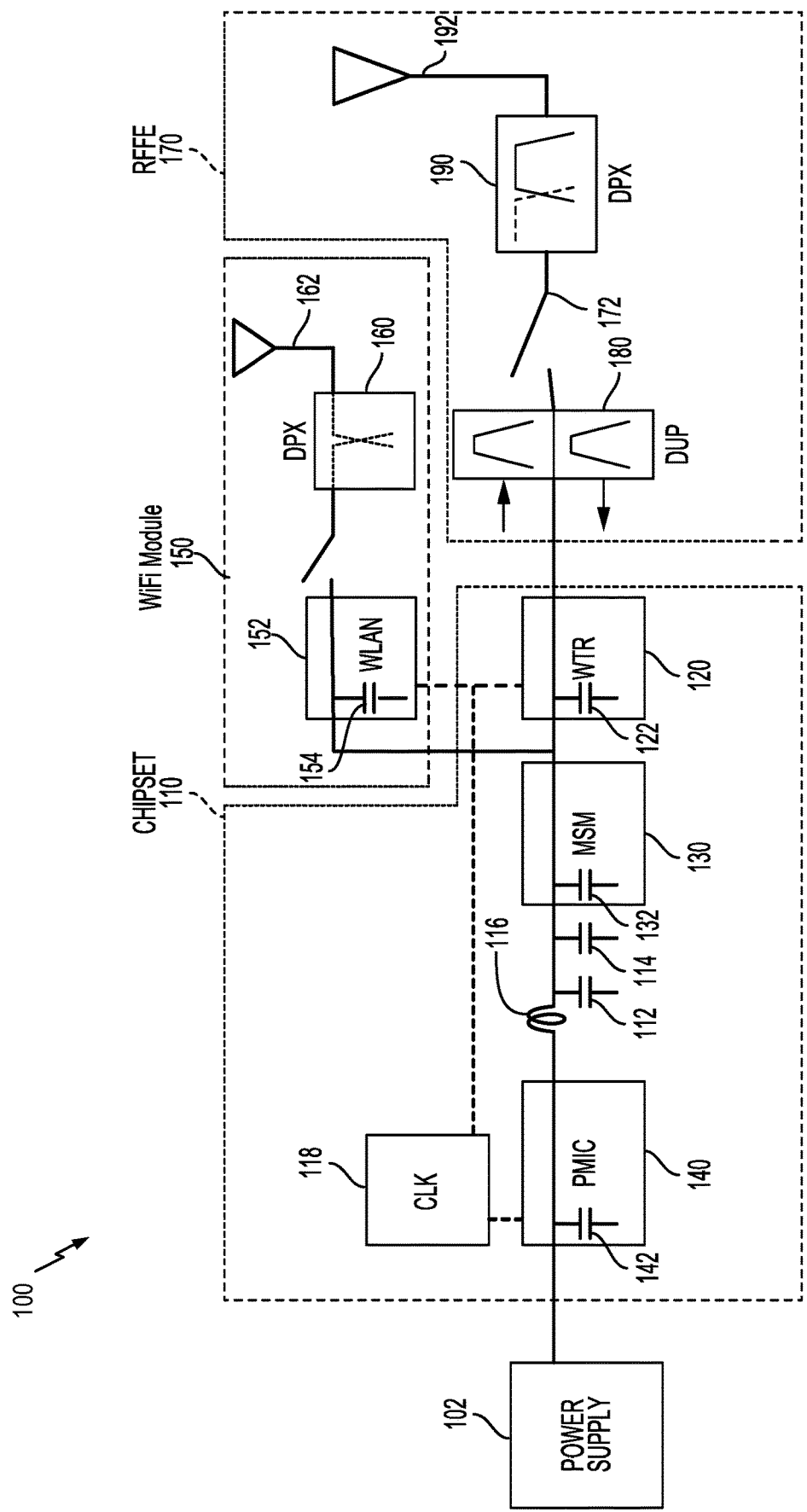
FIG. 1 is a schematic diagram of a wireless device having a wireless local area network module and a radio frequency (RF) front end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers may include using semiconductor on insulator technology. Semiconductor on insulator (SOI) technology replaces conventional silicon substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on an SOI layer and an SOI substrate supporting the BOX layer.

For example, a thickness of the BOX layer determines a distance between the active devices and an SOI substrate separated from the active devices by the BOX layer. A sufficient distance between the active device and the SOI substrate is important for improving active device performance. Reducing device footprints for meeting specifications of future process nodes, however, also reduces a thickness of the BOX layer, which defines the distance between the active device and the SOI substrate. Reducing the thickness of the BOX layer in future process nodes may significantly reduce device performance due to artificial harmonics. That is, device performance is degraded by increasing a proximity of the active device and the SOI substrate in future process nodes.

The active devices on the SOI layer may include high performance complementary metal oxide semiconductor (CMOS) transistors. For example, high performance CMOS RF switch technologies are currently manufactured using SOI substrates. An RF front end (RFFE) may rely on these high performance CMOS RF switch technologies for successful operation. A process for fabricating an RFFE, therefore, involves the costly integration of an SOI wafer for supporting these high performance CMOS RF switch technologies. Furthermore, support for future RF performance enhancements involves increased device isolation while reducing RF loss.

One technique for increasing device isolation and reducing RF loss is fabricating an RFFE using SOI wafers. For example, an RF device (e.g., an RF switch device) may include transistors fabricated using an SOI wafer. Unfortunately, transistors fabricated using SOI technology may suffer from the floating body effect. The floating body effect is a phenomenon in which the transistor's body collects charge generated at junctions of the transistor device. In this case, charge that accumulates in the body causes adverse effects, such as parasitic transistors in the structure and off-state leakage.

In addition, when a high power RF-signal is applied to the transistor device in an off-state, this accumulated charge can lead to charge sloshing in the channel region, between the source and drain ends of the transistor device. Unfortunately, charge sloshing in the channel region of the transistor device significantly detrimentally affects out of band harmonics. This accumulated charge also causes dependence of the threshold voltage of the transistor device on its previous states. The floating body effect may also generate out-of-band harmonic frequencies, which are detrimental to future communication enhancements.

Various aspects of the present disclosure provide a transistor layout for improving harmonic performance. The process flow for semiconductor fabrication of the integrated RF circuit may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

Aspects of the present disclosure relate to a transistor layout for improving harmonic performance. That is, aspects of the present disclosure employ a switch transistor reconfiguration to form a single switch transistor using interconnected multi-fingers transistors in a reconfigured footprint relative to an original switch transistor footprint. According to this aspect of the present disclosure, an RF integrated circuit (RFIC) includes interconnected multi-finger transistors, each including a discrete diffusion region and arranged within the reconfigured form factor. The multi-finger transistors may be interconnected through a source bus and a drain bus.

For example, the source bus may include first source fingers coupled to each source region of the multi-finger transistors and second source fingers orthogonally coupled to the first plurality of source fingers. The second source fingers may couple the discrete diffusion regions in parallel. In addition, the drain bus may include first drain fingers coupled to each drain region of the multi-finger transistors and second drain fingers orthogonally coupled to the first drain fingers. The second drain fingers may electrically couple the discrete diffusion regions in parallel. The fingers of the source bus may be interdigitated with the fingers of the drain bus. The multi-finger transistors are also interconnected through interconnected body contacts to bias a body of each of the multi-finger transistors.

FIG. 1 is a schematic diagram of a wireless device 100 (e.g., a cellular phone or a smartphone) including a transistor layout for improving harmonic performance. The wireless device 100 has a wireless local area network (WLAN) (e.g., WiFi) module 150 and an RF front end module 170 for a chipset 110. The WiFi module 150 includes a first diplexer 160 communicably coupling an antenna 162 to a wireless local area network module (e.g., WLAN module 152). The RF front end module 170 includes the second diplexer 190 communicably coupling an antenna 192 to the wireless transceiver 120 (WTR) through a duplexer 180 (DUP). An RF switch 172 communicably couples the second diplexer 190 to the duplexer 180. The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile RF transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna and may amplify the received RF signal using a low noise amplifier (LNA) and process the received RF signal to recover data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

The wireless transceiver 120 and the RF front end module 170 may be implemented using semiconductor on insulator (SOI) technology for fabricating transistors of the wireless transceiver 120, which helps reduce high order harmonics in the RF front end module 170. SOI technology replaces conventional semiconductor substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on an SOI layer and an SOI substrate supporting the BOX layer. An active device fabricated using SOI technology is shown in FIG. 2.

Figure 2:
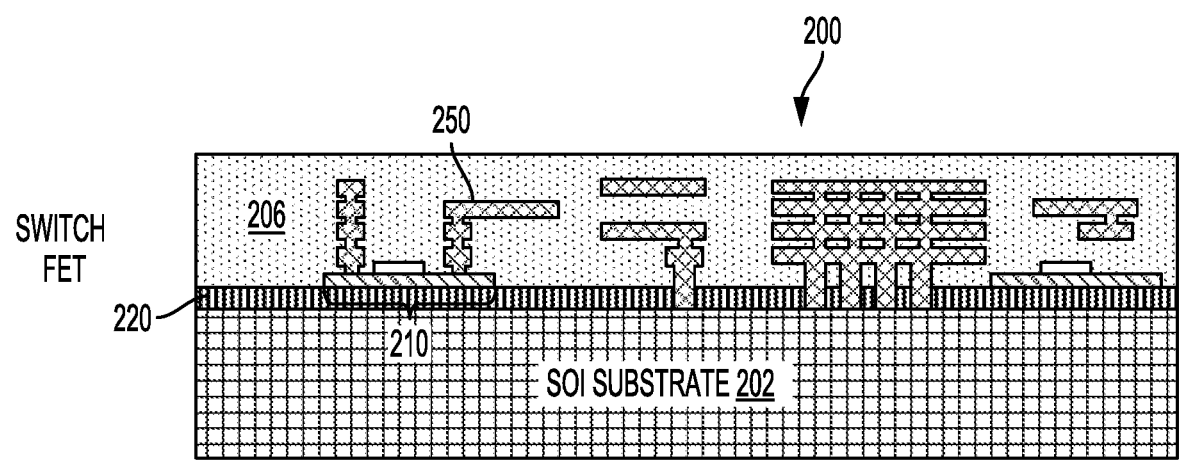
FIG. 2 show cross a sectional view of a radio frequency (RF) integrated circuit (RFIC), including an RF semiconductor on insulator (SOI) device.

FIG. 2 shows cross a sectional view of a radio frequency (RF) integrated circuit (RFIC) 200. As shown in FIG. 2, an RF silicon on insulator (SOI) device includes an active device 210 on a buried oxide (BOX) layer 220 supported by an SOI substrate 202 (e.g., a silicon wafer). The RF SOI device may be fabricated as complementary metal oxide semiconductor (CMOS) transistor using a CMOS process. The RF SOI device also includes interconnects 250 coupled to the active device 210 within a first dielectric layer 206. In this configuration, a parasitic capacitance of the RF SOI device is proportional to a thickness of the BOX layer 220, which determines the distance between the active device 210 and the SOI substrate 202.

The active device 210 on the BOX layer 220 may be a CMOS transistor. For example, high performance CMOS RF switch technologies are currently manufactured using SOI substrates. The RFFE 170 (FIG. 1) may rely on these high performance CMOS RF technologies for successful operation. A process for fabricating the RFFE 170, therefore, involves integration of an SOI wafer to support these high performance CMOS RF technologies. Furthermore, support for future RF performance enhancements involves increased device isolation while reducing RF loss. The RF integrated circuit 200 may be used to implement the RFFE 170 in FIG. 1. For example, the active device 210 may be a switch field effect transistor (FET) of the RF switch 172 of the RFFE 170.

The configuration of the RF integrated circuit 200 increases device isolation and reduces RF loss by using an SOI wafer for implementing the RFFE 170. Unfortunately, because the RF integrated circuit 200 is fabricated using SOI technology, the active device 210 may suffer from the floating body effect. The floating body effect is a phenomenon in which the transistor's body collects charge generated at the junctions of the transistor device. Charge that accumulates in the body causes adverse effects, such as parasitic transistors in the structure and off-state leakage (e.g., a gate induced drain leakage (GIDL) current). In addition, the accumulated charge also causes dependence of the threshold voltage of the transistor on its previous states. The floating body effect may also generate undesired, out-of-band harmonic frequencies, which are detrimental to communication enhancements integrated within the RFFE 170.

During an off state, the active device 210 (e.g., a switch field effect transistor (FET)) isolates the RF integrated circuit 200 from an input power (Pin). Isolation of the input power Pin by the active device 210 is increased by negatively biasing a gate of the active device 210, for hard turn-off of the active device 210. Hard turn-off of a switch FET (e.g., the active device 210) is a function of a body current (Ib). Unfortunately, negatively biasing the gate of the active device 210 may lead to deep depletion of the channel of the active device 210. Negatively biasing the gate of the active device 210 also causes accumulation of holes at the bottom channel region, due to small semiconductor thickness at the semiconductor-insulator boundary in semiconductor-on-insulator (SOI) technology. Furthermore, isolation provided by the insulator region creates a lack of body node, causing the charge to accumulate in a body of the active device 210. When an RF signal is applied at the Pin of the active device 210 in the isolated state, this charge moves in conjunction with the RF signal, causing charge sloshing and out-of-band harmonics.

In addition, negatively biasing the gate of the active device 210 may significantly increase a gate-to-drain voltage (Vgd) of the active device 210. The high gate-to-drain voltage Vgd triggers a gate induced drain leakage (GIDL) current, causing charge to accumulate in a body of the active device 210. That is, a high potential difference between the gate and the drain of the switch FET causes the GIDL current. Furthermore, when an RF signal is received at the source/drain of the active device 210, the RF signal may be corrupted. For example, if the gate of the active device 210 fails to isolate the RF signal from, for example, a RF power leaking towards the gate of the active device 210, the RF signal is significantly corrupted. Isolating the RF signal (e.g., the gate) from the RF power leakage may be referred to as RF isolation.

Current switch products may include a body contact for extracting the accumulated charge in the body of the switch transistor by biasing the body contact of the switch FET (e.g., the active device 210) independently from the gate of the switch FET. In addition, resistors may isolate the gate of the switch FET from the power supply. While these techniques provide RF isolation, biasing the body independent from biasing the gate of the switch FET causes the body to move independently from the gate. This independent movement of the body may generate undesired out-of-band harmonics. Furthermore, separately biasing the gate and the body may involve separate charge pumps for providing external gate and body voltages. Using separate charge pumps, however, consumes significant chip area of the RF integrated circuit 200.

One technique for preventing independent movement of the body involves tying the body contact to the gate of the switch FET through a diode. In addition, an external resistor may be coupled to a node of a gate-diode-body tie for providing RF isolation of the gate from the power supply for protecting RF signals. Removing accumulated charge from the active device 210 improves breakdown of the active device.

Reducing the gate voltage Vg also reduces a breakdown voltage of the switch FET because the breakdown voltage is a function of the gate voltage Vg. That is, the gate voltage Vg is negatively affected by the body current Ib of the switch FET due to the voltage drop across the external resistor. As noted above, the body current Ib is based on a magnitude of the input power Pin applied to the switch FET and the gate voltage applied.

Another source of out-of-band harmonics may be due to holes in a source/drain (SD)-body interface of the active device 210 (e.g., switch FET) of the RF integrated circuit 200. In off-state operation, holes are generated in the body of the active device. When RF power is applied to the switch FET in an off-state, these holes tend to follow the RF signal. As a result, the holes cause charge sloshing between the source and drain regions of the switch FET. Effective removal of the holes in the SD-body interface for improving harmonics of the RF integrated circuit 200 is desirable.

Body contacts may provide a way to remove these holes from the SD-body interface. Generally, body contacts can be at either one end or both ends of each gate finger of the active device 210. Unfortunately, even when the body contacts are positioned at both ends of the gate fingers, extraction of holes from a center of the active device 210 becomes more difficult as a width of the active device is increased. For example, gate finger widths in switch products may range from 10 to 25 microns, which makes hole extraction very difficult.

One technique for improving hole extraction is decreasing a gate finger width to a range of one to four microns, which reduces a distance between the source and drain regions of the active device 210. This reduced distance improves performance, while providing improved extraction of holes in the body. The improved hole extraction significantly improves out-of-band harmonic frequencies (e.g., third-order harmonics). The reduced distance also improves breakdown of the active device. Unfortunately, an aspect ratio caused by the reduced gate finger width is impractical for implementing in commercial products.

Figure 3:
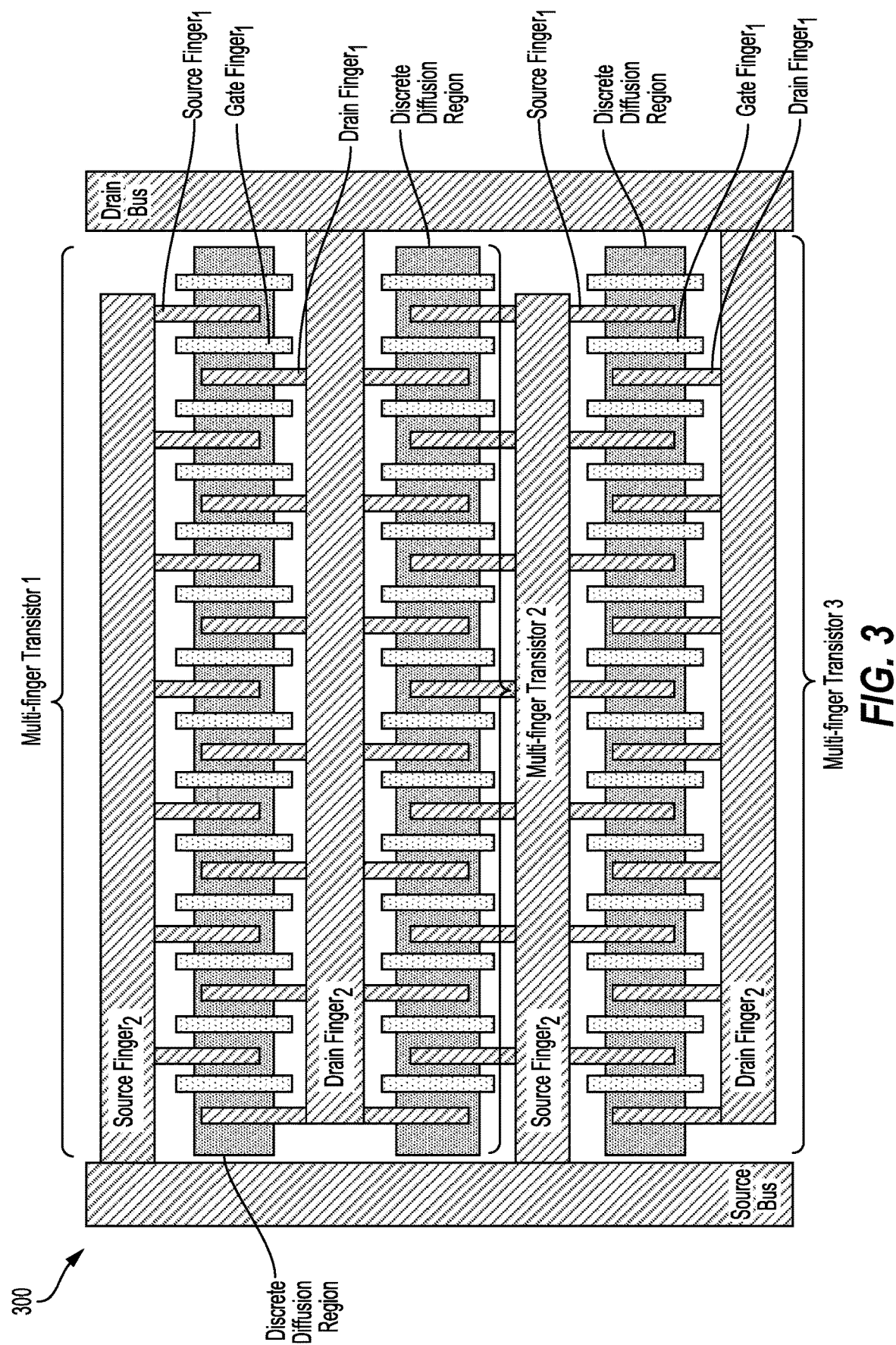
FIGS. 3 and 4 are schematic diagrams illustrating reconfiguration of a switch transistor into a single transistor layout for improving harmonic performance, according to aspects of the present disclosure.

Various aspects of the present disclosure provide a transistor layout for improving harmonic performance, as described in FIGS. 3-6. These aspects of the present disclosure employ a switch transistor reconfiguration for forming multi-finger transistors in the footprint of a switch product (e.g., a single transistor). For example, an RF integrated circuit (RFIC) may include interconnected transistors, each having a discrete diffusion region and arranged within the form factor of a single transistor. The transistors may be interconnected through source and drain buses at various interconnect levels (e.g., Mx), as shown in FIG. 3.

Figure 4:
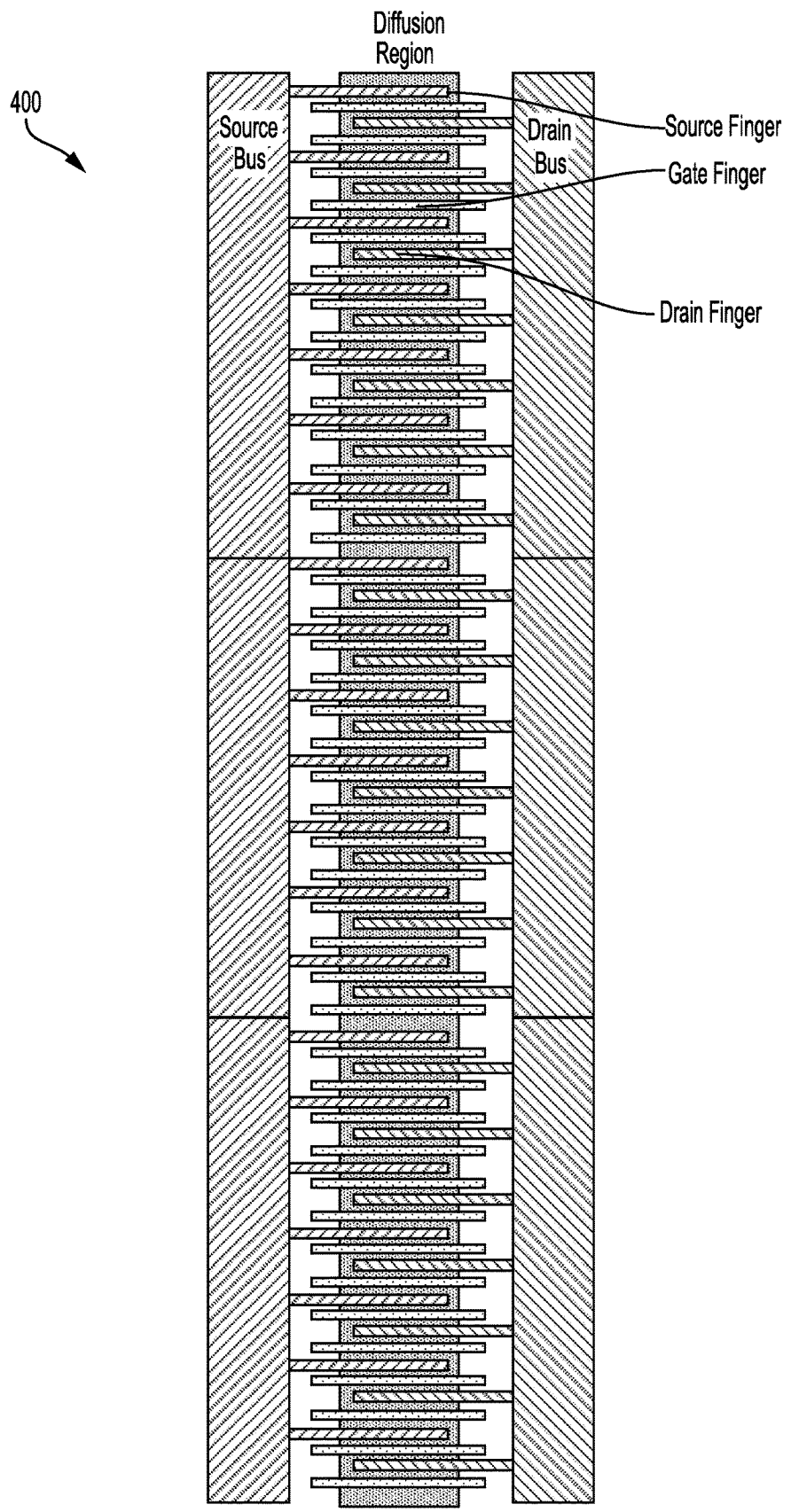

FIGS. 3 and 4 are schematic diagrams illustrating reconfiguration of a switch transistor 400 into an interconnected multi-finger transistor layout within a reconfigured form factor for improving harmonic performance, according to aspects of the present disclosure. In this configuration, a radio frequency integrated circuit (RFIC) 300 includes discrete diffusion regions (e.g., active areas) for supporting multi-finger transistors (e.g., Multi-finger Transistor 1, Multi-finger Transistor 2, and Multi-finger Transistor 3) that are interconnected within a reconfigured form factor.

As shown in FIG. 4, the switch transistor 400, including a source bus connected to source fingers and a drain bus connected to drain fingers on a long and narrow diffusion region. Unconnected gate fingers are also shown to further illustrate the switch transistor 400. The long and narrow configuration of the diffusion region enables decreasing of the gate finger width to approximately one (1) to four (4) microns. This decreased gate finger width is beneficial for extracting holes in the body of the switch transistor 400, which significantly improves off-state third order out-of-band harmonics as well as breakdown resistance. Unfortunately, the long, narrow form factor of switch transistor 400 exhibits an aspect ratio that is impractical for implementing in switch products.

In the configuration shown in FIG. 3, the long and narrow diffusion region of the switch transistor 400 is separated into discrete diffusion regions (e.g., active areas). In this configuration, the discrete diffusion regions are arranged within a reconfigured form factor that is wider than the form factor of the switch transistor 400. Subdividing and rearranging the diffusion region of the switch transistor 400 enables formation of multi-finger transistors. In this example, multi-finger transistors (e.g., Multi-finger Transistor 1, Multi-finger Transistor 2, and Multi-finger Transistor 3) are interconnected within the reconfigured form factor to form a single switch transistor. An improved aspects ratio of the single switch transistor enabling implementation in switch products.

The RFIC 300 includes a source bus having a first set of source fingers (e.g., Source Finger$_1$) coupled to each source region of the interconnected multi-finger transistors. The source bus also includes a second set of source fingers (e.g., Source Finger$_2$), orthogonally and electrically coupled to the first set of source fingers. In this example, the second set of source fingers electrically couples the discrete diffusion regions in parallel, according to a horizontal arrangement of the discrete diffusion regions. The RFIC 300 further includes a drain bus having a first set of drain fingers (e.g., Drain Finger$_1$) coupled to each drain region of the interconnected multi-finger transistors. The drain bus also includes a second set of drain fingers (e.g., Drain Finger$_2$), orthogonally and electrically coupled to the first set of drain fingers. In this configuration, the second set of drain fingers electrically also couples the discrete diffusion regions in parallel. Gates (e.g., Gate Finger$_1$) of the interconnect multi-finger transistors are also shown According to aspects of the present disclosure, the first set of source and drain fingers may be coupled to the source/drain regions of the interconnected multi-finger transistors at a first interconnect level (e.g., metal x (Mx)). Similarly, the second set of source and drain fingers may be coupled to the first set of source and drain regions of the interconnected transistors at a same or next interconnect level (e.g., (Mx, Mx+1)). These interconnect levels may be middle-of-line (MOL) interconnect levels and/or back-end-of-line interconnect (BEOL) levels. For example, the first set of source and drain fingers may be fabricated using a first BEOL interconnect layer (e.g., metal 1 (M1)) that is coupled to the source/drain regions of the interconnected transistors by a MOL interconnect layer (e.g., metal zero (M0)). In this example, the second set of source and drain fingers may be fabricated using a second BEOL interconnect layer (e.g., metal 2 (M2)).

As further illustrated in FIG. 3, the interconnected multi-finger transistors (along a gate length dimension) are oriented parallel to second source fingers (Source Finger$_2$) and the second drain fingers (Drain Finger$_2$) of the source bus and the drain bus. In addition, the interconnected multi-finger transistors (along the gate length dimension) are oriented perpendicular to the first source fingers (Source Finger$_1$) and the first drain fingers (Drain Finger$_1$) of the source bus and the drain bus. In this configuration, the source bus and the drain bus are arranged in a pitchfork orientation. Although not shown in FIG. 3, the interconnect multi-finger transistors (e.g., Multi-finger Transistor 1, Multi-finger Transistor 2, and Multi-finger Transistor 3) are also interconnected through interconnected body contacts to bias a body of each of the interconnected transistors, as further illustrated in FIG. 5.

Figure 5:
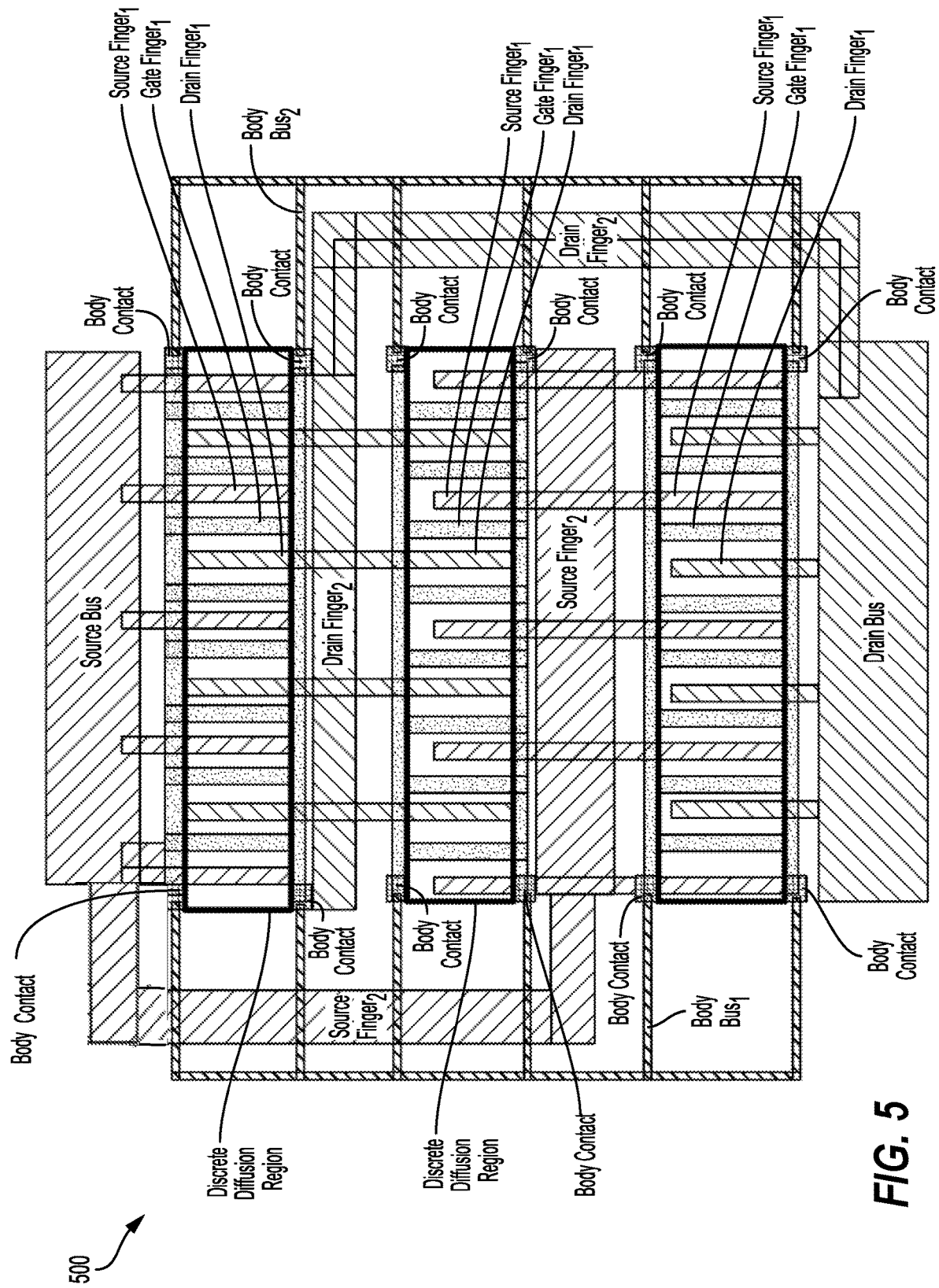
FIG. 5 is a schematic diagram illustrating a transistor layout showing body contacts for improving harmonic performance, according to aspects of the present disclosure.

FIG. 5 is a schematic diagram illustrating an H-gate transistor layout showing body contacts for improving harmonic performance, according to aspects of the present disclosure. In this configuration, a radio frequency integrated circuit (RFIC) 500 includes discrete diffusion regions (e.g., active areas) for supporting multi-finger transistors interconnected within a reconfigured form factor (e.g., large width) as a single switch transistor (e.g., the switch transistor 400). Similar to the configuration shown in FIG. 3, the RFIC 500 includes a source bus having a first set of source fingers (e.g., Source Finger$_1$) coupled to each source region of the discrete diffusion regions. The source bus also includes a second set of source fingers (e.g., Source Finger$_2$) orthogonally and electrically coupled to the first set of source fingers. In this example, the second set of source fingers electrically couples the discrete diffusion regions in parallel in this horizontal arrangement of the discrete diffusion regions.

The RFIC 500 further includes a drain bus having a first set of drain fingers (e.g., Drain Finger$_1$) coupled to each drain region of the discrete diffusion regions. The drain bus also includes a second set of drain fingers (e.g., Drain Finger$_2$) orthogonally and electrically coupled to the first set of drain fingers. In this configuration, the second set of drain fingers electrically couples the discrete diffusion regions in parallel.

In this example, the RFIC 500 includes a body bus configured to electrically couple body contacts of each of the discrete diffusion regions. For example, a first body bus (e.g., Body Bus$_1$) electrically couples the body contacts at a first end of the discrete diffusion regions. In addition, a second body bus (e.g., Body Bus$_2$) electrically couples the body contacts at a second end of the discrete diffusion regions. The gate fingers (e.g., Gate Finger$_1$) may tie each body contact to a gate. This configuration of the RFIC 500 may be referred to as an H-gate configuration. By contrast, in a T-gate transistor configuration, body contacts are arranged only on the source side or only on the drain side for all the discrete diffusions.

Figure 6:
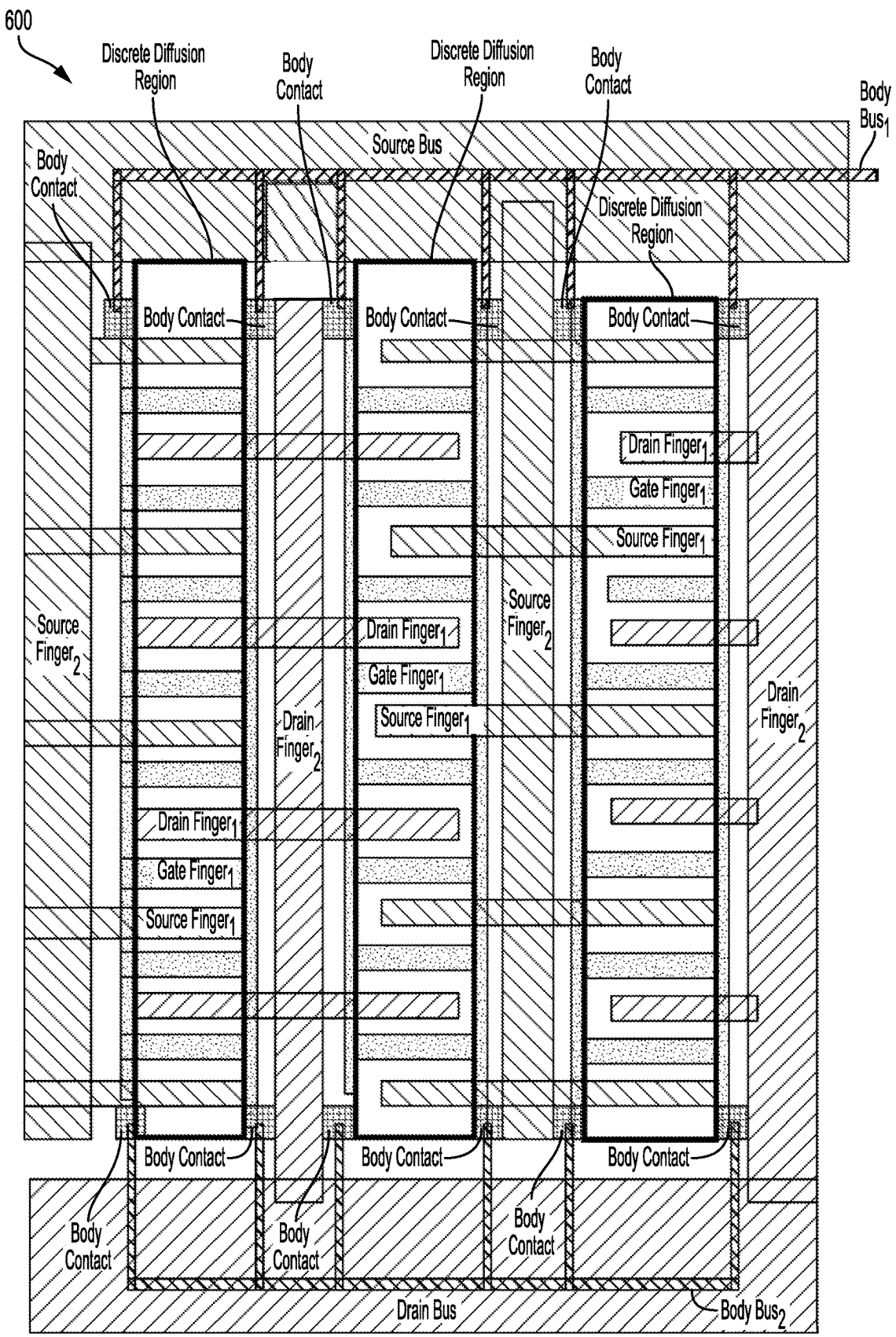
FIG. 6 is a schematic diagram illustrating a transistor layout showing body contacts for further improving harmonic performance, according to aspects of the present disclosure.

FIG. 6 is a schematic diagram illustrating a transistor layout showing body contacts for improving harmonic performance, according to aspects of the present disclosure. In this configuration, an RFIC 600 includes discrete diffusion regions (e.g., active areas) for supporting multi-finger transistors integrated within a large width form factor as a single switch transistor. Similar to the configuration shown in FIG. 5, the RFIC 600 includes a source bus having a first set of source fingers (e.g., Source Finger$_1$) coupled to each source region of the discrete diffusion regions. The source bus also includes a second set of source fingers (e.g., Source Finger$_2$) orthogonally and electrically coupled to the first set of source fingers. In this example, the second set of source fingers electrically couples the discrete diffusion regions in parallel.

The RFIC 600 further includes a drain bus having a first set of drain fingers (e.g., Drain Finger$_1$) coupled to each drain region of the discrete diffusion regions. The drain bus also includes a second set of drain fingers (e.g., Drain Finger$_2$) orthogonally and electrically coupled to the first set of drain fingers. This configuration also electrically couples the discrete diffusion regions in parallel using the second set of drain fingers. In contrast to the configurations shown in FIGS. 3 and 5, the discrete diffusion regions of the RFIC 600 are arranged vertically, rather than horizontally as shown in FIGS. 3 and 5.

In this configuration, the RFIC 600 also includes a body bus configured to electrically couple body contacts of each of the discrete diffusion regions. The body contacts may be tied to gates of the discrete diffusion regions using the gate fingers (e.g., Gate Finger$_1$). In this example, a first body bus (e.g., Body Bus$_1$) electrically couples the body contacts at a first end of the discrete diffusion regions. In addition, a second body bus (e.g., Body Bus$_2$) electrically couples the body contacts at a second end of the discrete diffusion regions. Although shown in an H-gate transistor configuration, the body contacts may be rearranged to support a T-gate transistor configuration.

Figure 7:
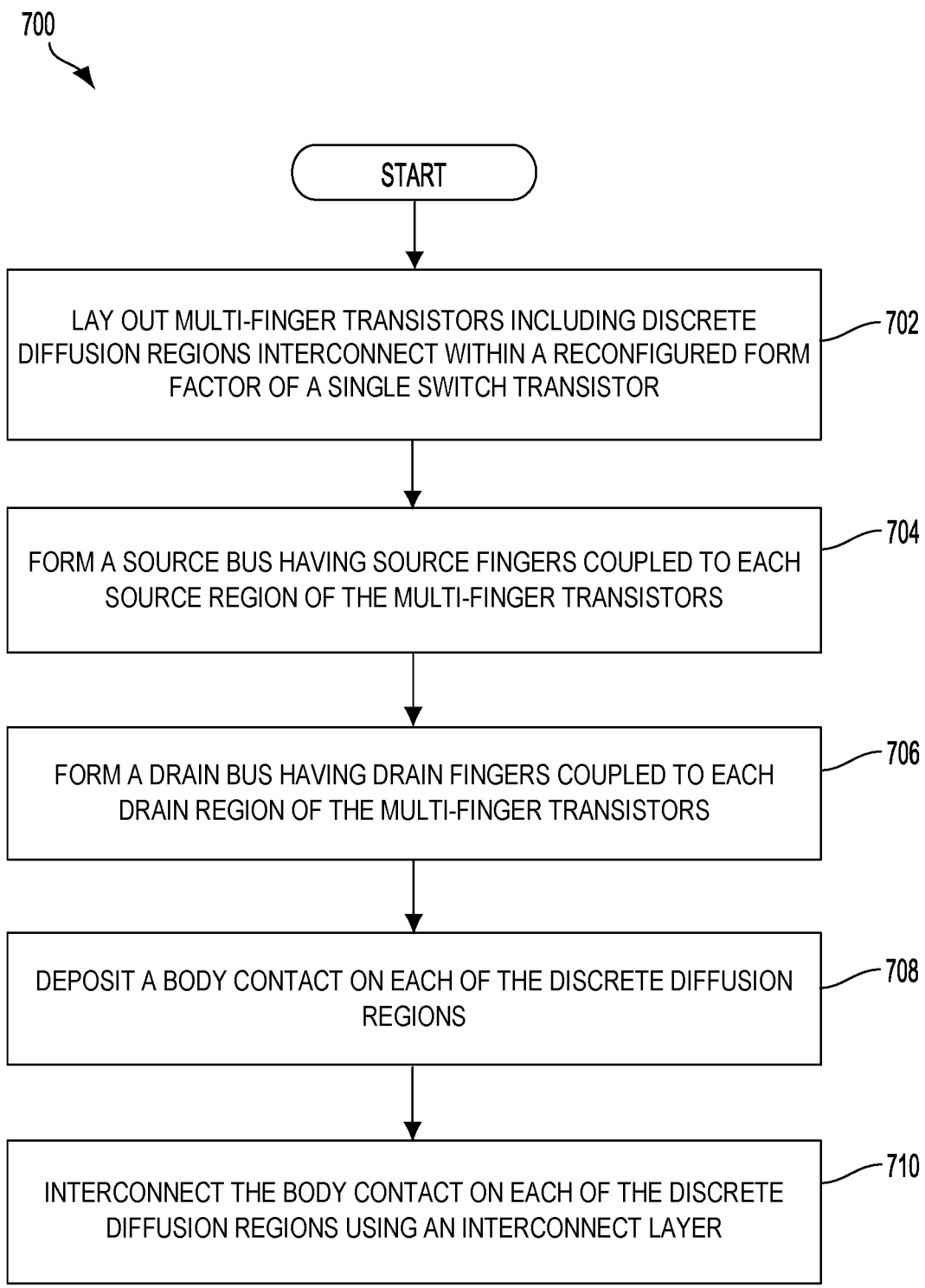
FIG. 7 is a process flow diagram illustrating a method of constructing a radio frequency (RF) integrated circuit (RFIC) using a transistor layout for improving harmonic performance, according to aspects of the present disclosure.

A method of constructing an RFIC having a transistor layout for improving harmonic performance, according to aspects of the present disclosure is shown in FIG. 7.

FIG. 7 is a process flow diagram illustrating a method 700 of constructing an RFIC having a transistor layout for improving harmonic performance, according to aspects of the present disclosure. In block 702, multi-finger transistors including discrete diffusion regions are laid out and interconnected within a reconfigured form factor of a single switch transistor. For example, as shown in FIGS. 3 and 4, multi-finger transistors (e.g., Multi-finger Transistor 1, Multi-finger Transistor 2, and Multi-finger Transistor 3) are fabricated and interconnected within a reconfigured form factor to form the switch transistor 400 (e.g., a gate finger width of approximately 20 microns). In block 704, a source bus having source fingers coupled to each source region of the multi-finger transistors is formed. For example, as shown in FIG. 3, the source bus includes fingers coupled to each of the source regions of the multi-finger transistors (e.g., Multi-finger Transistor 1, Multi-finger Transistor 2, and Multi-finger Transistor 3.

Referring again to FIG. 7, in block 706, a drain bus having fingers coupled to each drain region of the multi-finger transistors is formed. For example, as shown in FIG. 3, the drain bus includes fingers coupled to each of the drain regions of the multi-finger transistors. Referring again to FIG. 7, in block 708, a body contact is deposited on each of the discrete diffusion regions. The body contact may be only on the source end, only on the drain end, or on both the source end and the drain end of the discrete diffusion regions according to a desired transistor configuration. In block 710, the body contact on each of the discrete diffusion regions is interconnected using an interconnect layer. For example, as shown in FIG. 3, interconnected body contacts are shown for each of the multi-finger transistors (e.g., Multi-finger Transistor 1, Multi-finger Transistor 2, and Multi-finger Transistor 3.

Additional transistor layouts as well as a pitchfork layout (e.g., a pitchfork orientation or a pitchfork pattern) for interconnecting the body contacts and source/drain regions are shown and described in FIGS. 5 and 6. For example, as shown in FIGS. 5 and 6, the method 700 of constructing the RFIC may include depositing a first body contact at a first end of each of the discrete diffusion regions, and depositing a second body contact at a second end of each of the discrete diffusion regions. Once deposited, the method 700 may also include depositing a conductive layer (e.g., a metallization layer) to form a body bus configured to interconnect the body contact on each of the discrete diffusion regions in a pitchfork pattern. For example, in FIGS. 5 and 6 a first body bus (Body Bus$_1$) and a second body bus (Body Bus$_2$) interconnect body contacts on opposing sides of the discrete diffusion regions.

According to a further aspect of the present disclosure, an RF integrated circuit, including a transistor layout for improved harmonic performance, is described. The RF integrated circuit has means for interconnecting body contacts to discrete diffusion regions to bias a body of each interconnected transistors. The interconnect means may be an interconnect layer, shown in FIG. 3. In another aspect, the aforementioned means may be any module or any apparatus configured to perform the functions recited by the aforementioned means.

Figure 8:
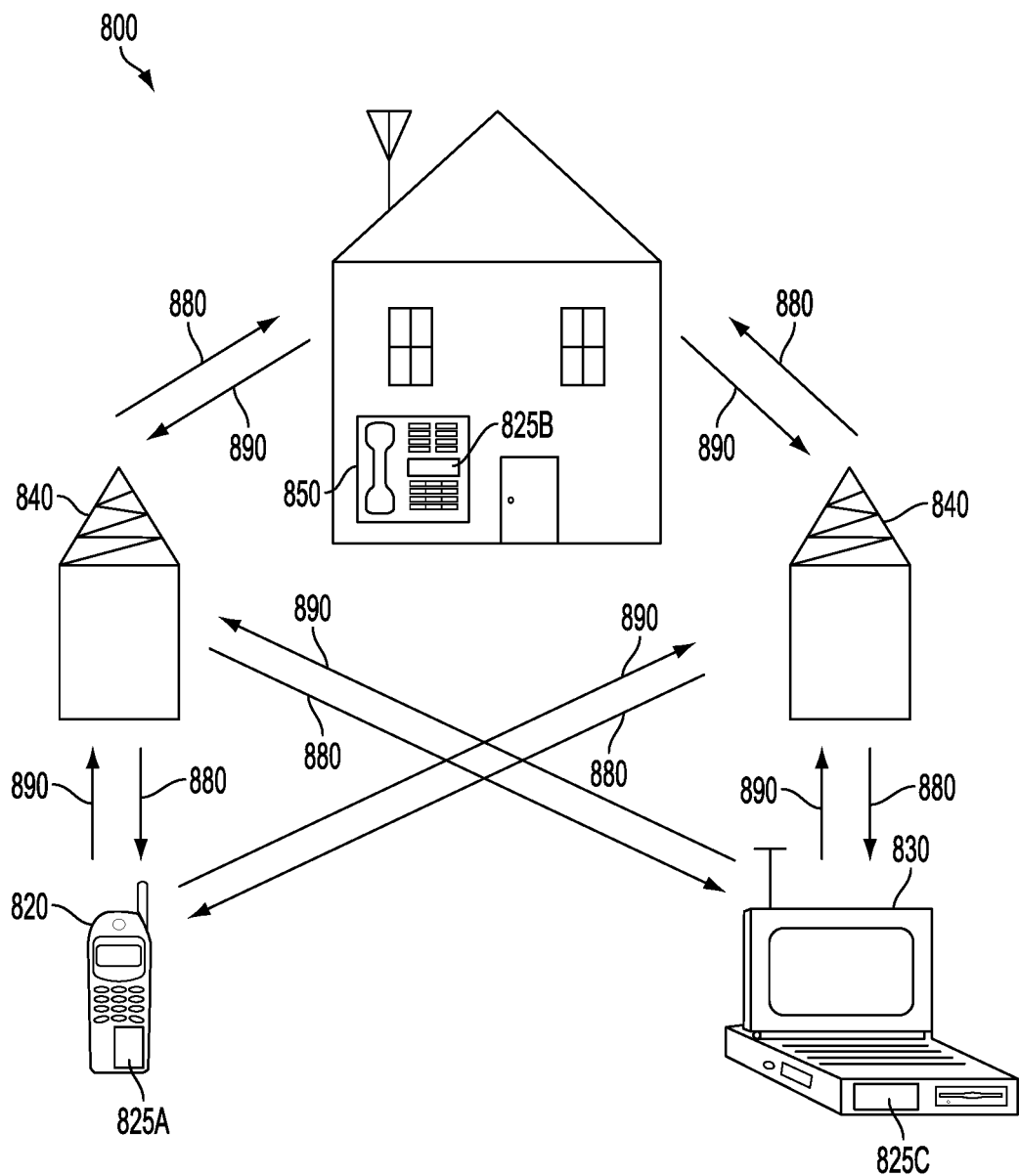
FIG. 8 is a block diagram showing an exemplary wireless communication system in which a configuration of the present disclosure may be advantageously employed.

FIG. 8 is a block diagram showing an exemplary wireless communication system 800 in which an aspect of the present disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed RFIC. It will be recognized that other devices may also include the disclosed RFIC, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 8 illustrates remote units, according to the aspects of the present disclosure, the present disclosure is not limited to these exemplary illustrated units. Aspects of the present disclosure may be suitably employed in many devices, which include the disclosed RFIC.

Figure 9:
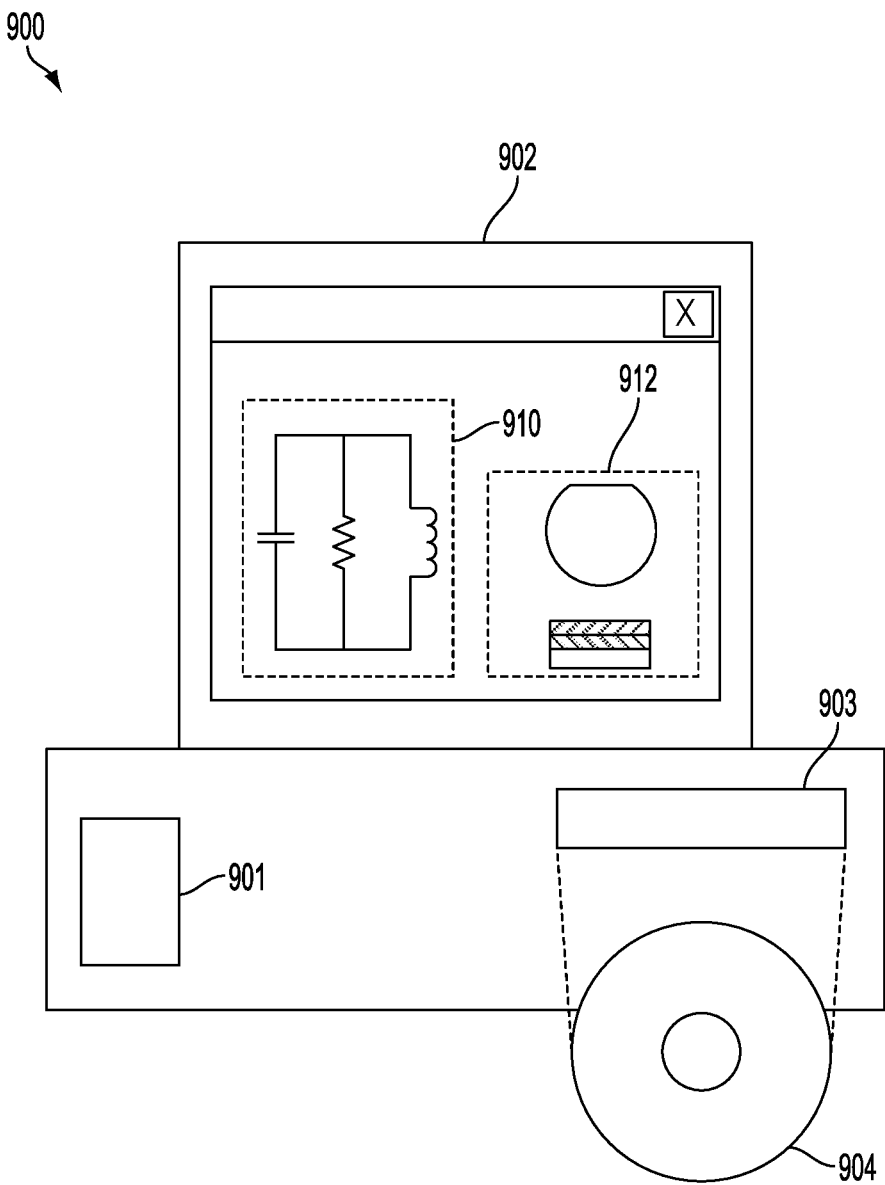
FIG. 9 is a block diagram illustrating a design workstation used for circuit, layout, and logic design of a semiconductor component, according to one configuration.

FIG. 9 is a block diagram illustrating a design workstation used for circuit, layout, and logic design of a semiconductor component, such as the RF devices disclosed above. A design workstation 900 includes a hard disk 901 containing operating system software, support files, and design software such as Cadence or OrCAD. The design workstation 900 also includes a display 902 to facilitate a circuit design 910 or an RFIC 912. A storage medium 904 is provided for tangibly storing the circuit design 910 or the RFIC 912. The circuit design 910 or the RFIC 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit design 910 or the RFIC 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized, according to the present disclosure. Accordingly, the appended claims are intended to include within their scope such processes, machines, manufacture, compositions of matter, means, methods, or steps.

What is claimed is:

1. A radio frequency integrated circuit (RFIC), comprising:
    a plurality of multi-finger transistors including discrete diffusion regions having source regions and drain regions, the plurality of multi-finger transistors interconnected within a reconfigured form factor as a single switch transistor;
    a source bus coupled to a first plurality of source fingers, which are directly coupled to each source region of the plurality of multi-finger transistors, the source bus directly coupled to a second plurality of source fingers, which are orthogonally coupled to the first plurality of source fingers, the source bus electrically coupling the discrete diffusion regions in parallel;
    a drain bus coupled to a first plurality of drain fingers, which are directly coupled to each drain region of the plurality of multi-finger transistors, the drain bus directly coupled to a second plurality of drain fingers, which are orthogonally coupled to the first plurality of drain fingers, the drain bus electrically coupling the discrete diffusion regions in parallel, in which the second plurality of source fingers are interdigitated with the second plurality of drain fingers and the first plurality of source fingers are interdigitated with the first plurality of drain fingers; and
    a plurality of interconnected body contacts to bias a body of each of the plurality of multi-finger transistors.

2. The RFIC of claim 1, further comprising gates of the plurality of multi-finger transistors, the gates connected in parallel.

3. The RFIC of claim 1, in which the plurality of interconnected body contacts are coupled to each of the discrete diffusion regions at a first end and/or to each of the discrete diffusion regions at a second end.

4. The RFIC of claim 1, in which the plurality of multi-finger transistors are oriented parallel to the source bus and/or the drain bus.

5. The RFIC of claim 1, in which the plurality of multi-finger transistors are oriented perpendicular to the source bus and/or the drain bus.

6. The RFIC of claim 1, in which the source bus and the second plurality of source fingers are in a pitchfork orientation.

7. The RFIC of claim 1, in which the plurality of multi-finger transistors comprise complementary metal oxide semiconductor (CMOS) transistors on a silicon on insulator (SOI) substrate.

8. The RFIC of claim 1, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

9. A method of constructing a radio frequency (RF) integrated circuit, comprising:
    laying out a plurality of multi-finger transistors including discrete diffusion regions having source regions and drain regions, the plurality of multi-finger transistors interconnected within a reconfigured form factor as a single switch transistor;
    forming a source bus coupled to a first plurality of source fingers, which are directly coupled to each source region of the plurality of multi-finger transistors;
    directly coupling the source bus to a second plurality of source fingers, which are orthogonally coupled to the first plurality of source fingers;
    forming a drain bus coupled to a first plurality of drain fingers, which are directly coupled to each drain region of the plurality of multi-finger transistors;
    directly coupling the drain bus to a second plurality of drain fingers, which are orthogonally coupled to the first plurality of drain fingers, in which the second plurality of source fingers are interdigitated with the second plurality of drain fingers and the first plurality of source fingers are interdigitated with the first plurality of drain fingers;
    depositing a body contact on each of the discrete diffusion regions; and interconnecting the body contact on each of the discrete diffusion regions using an interconnect layer.

10. The method of claim 9, in which depositing the body contact comprises:
depositing a first body contact at a first end of each of the discrete diffusion regions; and
depositing a second body contact at a second end of each of the discrete diffusion regions.

11. The method of claim 9, in which interconnecting the body contact on each of the discrete diffusion regions comprises depositing a conductive layer to form a body bus configured to interconnect the body contact on each of the discrete diffusion regions in a pitchfork pattern.

12. The method of claim 9, further comprising integrating the RF integrated circuit into an RF front end module, the RF front end module incorporated into at least one of a music player, a video player, an entertainment unit, a navigation device, a communications device, a personal digital assistant (PDA), a fixed location data unit, a mobile phone, and a portable computer.

13. A radio frequency integrated circuit (RFIC), comprising:
a plurality of multi-finger transistors including discrete diffusion regions having source regions and drain regions, the plurality of multi-finger transistors interconnected within a reconfigured form factor as a single switch transistor;
a source bus coupled to a first plurality of source fingers, which are directly coupled to each source region of the plurality of multi-finger transistors, the source bus directly coupled to a second plurality of source fingers, which are orthogonally coupled to the first plurality of source fingers, the source bus electrically coupling the discrete diffusion regions in parallel;
a drain bus coupled to a first plurality of drain fingers, which are directly coupled to each drain region of the plurality of multi-finger transistors, the drain bus directly coupled to a second plurality of drain fingers, which are orthogonally coupled to the first plurality of drain fingers, the drain bus electrically coupling the discrete diffusion regions in parallel, in which the second plurality of source fingers are interdigitated with the second plurality of drain fingers and the first plurality of source fingers are interdigitated with the first plurality of drain fingers; and
means for interconnecting a plurality of body contacts to the discrete diffusion regions to bias a body of each of the plurality of multi-finger transistors.

14. The RFIC of claim 13, in which each of the discrete diffusion regions includes a first body contact at a first end and a second body contact at a second end.

15. The RFIC of claim 13, in which the plurality of multi-finger transistors are oriented parallel to the source bus.

16. The RFIC of claim 13, in which the plurality of multi-finger transistors are oriented perpendicular to the source bus.

17. The RFIC of claim 13, in which the source bus and the second plurality of source fingers are arranged in a pitchfork orientation.

18. The RFIC of claim 13, in which the plurality of multi-finger transistors comprise complementary metal oxide semiconductor (CMOS) transistors on a silicon on insulator (SOI) substrate.

19. The RFIC of claim 13, incorporated into at least one of a music player, a video player, an entertainment unit, a navigation device, a communications device, a personal digital assistant (PDA), a fixed location data unit, a mobile phone, and a portable computer.

* * * * *